US006992610B2

(12) United States Patent
Komarura

(10) Patent No.: US 6,992,610 B2
(45) Date of Patent: Jan. 31, 2006

(54) PWM SIGNAL GENERATOR AND PWM SIGNAL GENERATING METHOD

(75) Inventor: Mitsuya Komarura, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 61 days.

(21) Appl. No.: 10/829,182

(22) Filed: Apr. 22, 2004

(65) Prior Publication Data

US 2004/0212524 A1 Oct. 28, 2004

(30) Foreign Application Priority Data

Apr. 25, 2003 (JP) .............................. 2003-121163

(51) Int. Cl.
*H03M 1/82* (2006.01)
(52) U.S. Cl. ........................ 341/152; 341/53; 375/238
(58) Field of Classification Search ................ 341/152, 341/53; 375/238
See application file for complete search history.

(56) References Cited

U.S. PATENT DOCUMENTS

| 5,008,675 | A | * | 4/1991 | Toyomaki ................... 341/152 |
| 5,021,788 | A | * | 6/1991 | Ueki et al. .................. 341/152 |
| 5,148,168 | A | * | 9/1992 | Masuda et al. ............. 341/152 |
| 6,795,004 | B2 | * | 9/2004 | Masuda et al. ............. 341/143 |

FOREIGN PATENT DOCUMENTS

EP 0 457 496 A2 11/1991

OTHER PUBLICATIONS

Andreas C. Floros, et al., "A Novel and Efficient PCM to PWM Converter for Digital Audio Amplifiers", Electronics, Circuits and Systems, 1999., Proceedings of ICECS '99. The 6$^{th}$ IEEE International Conference on Pafos, Cyprus, Sep. 5-8, 1999, Piscataway, NJ, USA, IEEE, US, Audio Group, Wired Communications Laboratory University of Patras, 26500 Rio, Patras, p. 165-168.

* cited by examiner

Primary Examiner—Zandra V. Smith
Assistant Examiner—James Goodley
(74) Attorney, Agent, or Firm—Sughrue Mion, PLLC

(57) ABSTRACT

A PWM signal generator and generating method for generating one or two pulses having a pulse width or a total pulse width corresponding to a value represented by a pulse code modulation digital signal and placed in a symmetric positional relationship with respect to the position of one half of a predetermined length. A first pulse and a second pulse are generated in accordance with a value represented by the digital signal. The difference in pulse width between the first and second pulses is output as a first pulse width modulation signal. When the value represented by the digital signal is zero, the first pulse and second pulse are equal in pulse width. When the value represented by the digital signal changes by one, one of the first and second pulses does not change in pulse width, while the other of the first and second pulse changes in pulse width by two slots.

9 Claims, 16 Drawing Sheets

SPECTRUM OF SINGLE-SIDED BINARY PWM

SPECTRUM OF SINGLE - SIDED THREE - VALUED PWM

SPECTRUM OF DOUBLE - SIDED THREE - VALUED PWM

SPECTRUM OF PWM USING ONLY X - SERIES

SPECTRUM OF PWM USING X - SERIES AND Y - SERIES

PWM SIGNAL GENERATOR AND PWM SIGNAL GENERATING METHOD

BACKGROUND OF THE INVENTION

1. Field of the Invention

The present invention relates to a PWM signal generator and a PWM signal generating method for generating a pulse width modulation (PWM) signal in accordance with a pulse code modulation (PCM) digital signal.

2. Description of the Related Background Art

FIG. 1 shows the configuration of a digital-to-analog converter to which a conventional PWM signal generator is applied. The digital-to-analog converter comprises a digital interface 1, an oversampling circuit 2, a delta-sigma modulator 3, a PCM-PWM converter 4, a differential amplifier 5, and a low pass filter 6.

FIG. 2 shows the configuration of a conventional digital amplifier to which a conventional PWM signal generator is applied. The digital amplifier comprises a digital interface 11, an oversampling circuit 12, a digital volume 13, a delta-signal modulator 14, a PCM-PWM converter 15, a power switching circuit 16, and a low pass filter 17.

The digital amplifier 2 in FIG. 2 differs from the digital-to-analog converter illustrated in FIG. 1 only in that the digital volume 13 is provided, and the differential amplifier 5 is replaced by the power switching circuit 16, and is identical in the rest, so that the digital amplifier in FIG. 2 will be next described.

A digital signal read from a disk such as CD, DVD or the like is supplied into the digital amplifier through the digital interface 11, and the sampling frequency of the digital signal is increased by the oversampling circuit 12. Subsequently, the gain of the digital signal is adjusted by the digital volume 13.

The delta-sigma modulator 14 is for example, a noise shaper having subtractors 21, 23, a quantizer 22, and a filter 24, as shown in FIG. 3, and reduces the number of quantization bits of the gain adjusted digital signal. In the delta-signal modulator 14, quantization noise Nq(z) output from the subtractor 23 is fed back to the subtractor 21 on the input side through the filter 24 (transfer function H(z)). As a result, the spectrum of the quantization noise is converted to N'q(z)=[1−H(z)]Nq(z). By adjusting the transfer function H(z) of the filter 24, the quantization noise can be shifted to a higher frequency band to ensure the S/N ratio for an audio band, as shown in FIG. 4A. FIG. 4B is an enlarged view of the frequency spectrum in FIG. 4A.

The output digital signal of the delta-sigma modulator 14 is converted to two types of PWM signals by the PCM-PWM converter 15. The PWM signals consist of PWM_A and PWM_B which are supplied to the power switching circuit 16. The power switching circuit 16 converts the PWM signals PWM_A and PWM_B to a PWM differential signal indicating a differential component of PWM_A−PWM_B. The power switching circuit 16 includes an H-bridge switching circuit having four switching elements SW1–SW4, for example, as shown in FIG. 5. The differential signal PWM_A−PWM_B is supplied to a speaker 18 through the low pass filter 17. The low pass filter 17 supplies the speaker 18 with an audio band signal which is a lower band component of the differential signal PWM_A−PWM_B.

However, since digital PWM is essentially non-linear processing, this causes harmonic distortion and intermodulation distortion in signal components, and causes an intermodulation distortion in a quantization noise component. The intermodulation distortion component of the quantization noise shifted to a higher band by the noise shaping drop down to the audio band to raise the noise floor of the audio band. This exacerbates the harmonic distortion characteristic and S/N ratio of the PWM output as compared with the output of the delta-sigma modulator.

FIG. 6 shows a method of generating a single sided binary PWM signal. A PWM signal PWM_A having a pulse width in accordance with a PCM signal, and PWM_B which is a NOT signal of PWM_A are generated. A difference PWM_A−PWM_B of the PWM signals PWM_A and PWM_B is a PWM differential signal. The frequency spectrum of the PWM differential signal is as shown in FIG. 7, where a harmonic distortion is generated and the noise floor rises, as compared with the output of the delta-sigma modulator shown in FIG. 4.

Single-sided three-valued PWM, or double sided three-valued PWM is known as a prior art technique for reducing the harmonic distortion and lowering the noise floor. A method of generating a single sided three-valued PWM signal is performed as shown in FIG. 8. PWM signals PWM_A which has a pulse width in accordance with a PCM signal, and PWM_B which is 2's complement signal of PWM_A are generated. The difference PWM_A−PWM_B between the PWM signals PWM_A and PWM_B is a PWM differential signal. The frequency spectrum of the PWM differential signal is as shown in FIG. 9, where even-number order harmonic distortions disappear and the noise floor is lowered.

A method of generating a double sided three-valued PWM signal is performed as shown in FIG. 10. PWM signals PWM_A which has a pulse width in accordance with a PCM signal, and PWM_B which is a 2's complement signal of PWM_A are generated to be symmetric with respect to the center (four in this case). The difference PWM_A−PWM_B between the PWM signals PWM_A and PWM_B is a final PWM output signal. The frequency spectrum of the PWM output signal is as shown in FIG. 11, where even-number order harmonic distortions disappear and the noise floor is lowered further as compared with the single sided three-valued PWM.

As described above, when the single-sided three-valued PWM is employed for reducing the harmonic distortion and lowering the noise floor, even-number order harmonic distortions can be removed in principle. However, a problem lies in that odd-number order harmonic distortions still remain large. The double-sided three-valued PWM in turn provides an ideal modulation which removes the even-number order harmonic distortions, reduces the odd-number order harmonic distortions, and lowers the noise floor. However, since PWM_A and PWM_B must be generated to be symmetric with respect to the center even for odd-number PCM signals, a problem lies in that the clock frequency must be twice as high, and the configuration is complicated as compared with the single-sided PWM.

It is therefore an object of the present invention to provide a PWM signal generator and generating method which are capable of reducing both harmonic distortion and noise floor without doubling the clock frequency, and a digital-to-analog converter and a digital amplifier to which the PWM signal generator is applied.

SUMMARY OF THE INVENTION

A PWM signal generator according to the present invention comprises a signal generating device for generating one or two pulses which have a pulse width or a total pulse width corresponding to a value represented by a pulse code modulation digital signal and which have a symmetric positional relationship with respect to the position of one half of a predetermined length, as a first pulse width modulation signal, wherein the signal generating device includes a PCM (pulse code modulation)-PWM converter which generates a first pulse and a second pulse in accordance with the value represented by the digital signal, and a difference detector which outputs the difference between the first pulse and the second pulse, as the first pulse width modulation signal, and when the value represented by the digital signal is zero, the first pulse and the second pulse are equal to each other in pulse width, and when the value represented by the digital signal changes by one, one of the first and second pulses does not change in pulse width and the other of the first and second pulses changes in pulse width by two slots.

A PWM signal generating method according to the present invention generates one or two pulses having a pulse width or a total pulse width corresponding to a value represented by a pulse code modulation digital signal and placed in a symmetric positional relationship with respect to the position of one half of a predetermined length, as a first pulse width modulation signal, the method comprising the steps of: generating a first pulse and a second pulse in accordance with a value represented by the digital signal; outputting the difference between the first pulse and the second pulse, as the first pulse width modulation signal; and controlling the first pulse and the second pulse so that when the value represented by the digital signal is zero, the first pulse and the second pulse are equal to each other in pulse width, and when the value represented by the digital signal changes by one, one of the first and second pulses does not change in pulse width and the other of the first and second pulses changes in pulse width by two slots.

A PWM signal generating method according to the present invention generates one or two pulses having a pulse width or a total pulse width corresponding to a value represented by a pulse code modulation digital signal and placed in a symmetric positional relationship with respect to the position of one half of a predetermined length, as a first pulse width modulation signal, the method comprising the steps of: controlling the first pulse and the second pulse so that when the value represented by the digital signal is zero, the first pulse and the second pulse are equal to each other in pulse width, and when the value represented by the digital signal changes by one, one of the first and second pulses does not change in pulse width and the other of the first and second pulses changes in pulse width by two slots; detecting that a value represented by the digital signal is an odd-number; and when the value represented by the digital signal is an odd-number, generating the first pulse width modulation signal and a second pulse width modulation signal, alternately, the second pulse width modulation signal indicating two pulses having a total pulse width corresponding to the odd value and placed in a symmetric positional relationship to the one pulse or two pulses of the first pulse width modulation signal with respect to the positions of $1/4$ and $3/4$ of the predetermined length.

A digital-to-analog converter according to the present invention comprises: an oversampling circuit which oversamples an input pulse code modulation digital signal; a delta-sigma modulator which decreases the number of quantization bits of an output digital signal of the oversampling circuit; a PWM signal generator which generates one or two pulses having a pulse width or a total pulse width corresponding to a value represented by an output digital signal of the delta-sigma modulator and placed in a symmetric positional relationship with respect to the position of one half of a predetermined length, as a first pulse width modulation signal; and a low pass filter which outputs a low band component of the first pulse width modulation signal, wherein the PWM signal generator includes a PCM-PWM converter which generates a first pulse and a second pulse in accordance with the value represented by the output digital signal of the delta-sigma modulator, and a difference detector which outputs the difference between the first pulse and the second pulse, as the first pulse width modulation signal; and when the value represented by the output digital signal of the delta-sigma modulator is zero, the first pulse and the second pulse are equal to each other in pulse width, and when the value represented by the output digital signal of the delta-sigma modulator changes by one, one of the first and second pulses does not change in pulse width and the other of the first and second pulses changes in pulse width by two slots.

A digital amplifier according to the present invention comprises: an oversampling circuit which oversamples a pulse code modulation input digital signal; a digital volume which changes a gain indicated by an output digital signal of the oversampling circuit; a delta-sigma modulator which decreases the number of quantization bits of an output digital signal of the digital volume; a PWM signal generator which generates one or two pulses having a pulse width or a total pulse width corresponding to a value represented by an output digital signal of the delta-sigma modulator and placed in a symmetric positional relationship with respect to the position of one half of a predetermined length, as a first pulse width modulation signal; and a low pass filter which outputs a low band component of the first pulse width modulation signal, wherein the PWM signal generator includes a PCM-PWM converter which generates a first pulse and a second pulse in accordance with the value represented by the output digital signal of the delta-sigma modulator, and a difference detector which outputs the difference between the first pulse and the second pulse, as the first pulse width modulation signal; and when the value represented by the output digital signal of the delta-sigma modulator is zero, the first pulse and the second pulse are equal to each other in pulse width, and when the value represented by the output digital signal of the delta-sigma modulator changes by one, one of the first and second pulses does not change in pulse width and the other of the first and second pulses changes in pulse width by two slots.

DETAILED DESCRIPTION OF THE INVENTION

One embodiment of the present invention will hereinafter be described in detail with reference to the drawings.

Figure 12:
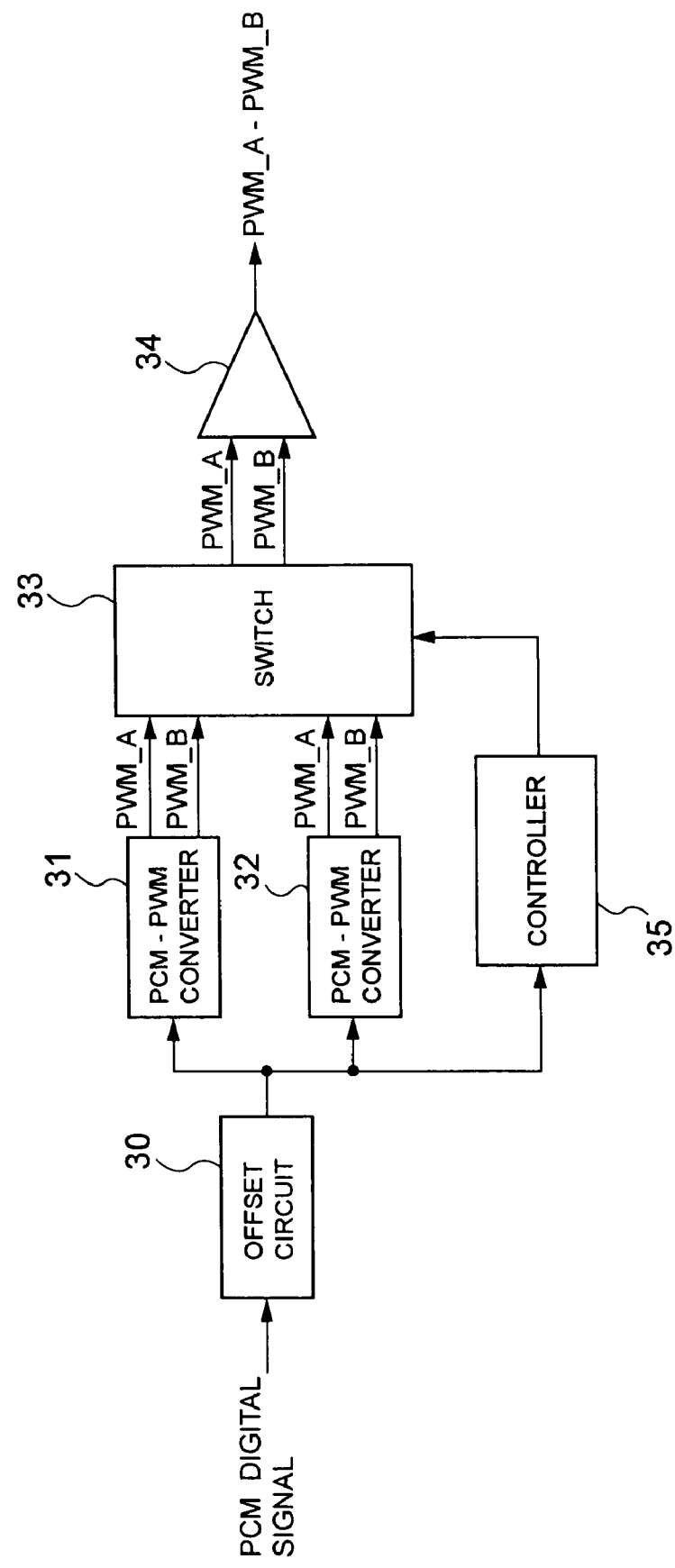
FIG. 12 is a block diagram showing an embodiment of the present invention.

FIG. 12 illustrates the general configuration of a PWM signal generator according to the present invention. The PWM signal generator comprises an offset circuit 30, PCM-PWM converters 31, 32, a switch 33, a difference detector 34, and a controller 35.

The offset circuit 30 adds an offset portion to a PCM input digital signal. Assuming that the input digital signal has the number of quantization bits B, the number of slots SLOT is $2^B$, and a digital signal PCM takes a value in the range of $-2^{B-1}+1$ to $2^{B-1}-1$. The offset portion by the offset circuit 30 is SLOT/2, so that a digital signal PCMOFST output from the offset circuit 30 can be represented by PCM+SLOT/2.

The PCM-PWM converters 31, 32 generate a PWM signal PWM_A (first pulse) and a PWM signal PWM_B (second pulse) for the PCM digital signal PCMOFST. The PWM signals PWM_A and PWM_B generated by the PCM-PWM converter 31 are labeled "X-series," while the PWM signals PWM_A and PWM_B generated by the PCM-PWM converter 32 are labeled "Y-series."

Figure 13:
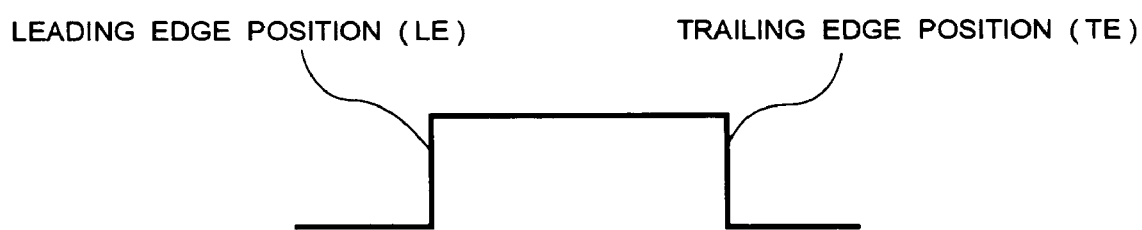
FIG. 13 is a diagram showing a leading edge position and a trailing edge position of a PWM signal.

Assume herein that a slot value at the leading edge of each pulse of the PWM signals PWM_A and PWM_B is LE, and a slot value at the trailing edge of the same is TE, as shown in FIG. 13.

In the X-series PCM-PWM converter 31, LE and TE of the PWM signal PWM_A are calculated by:

$LE=\text{SLOT}/2-(INT)(PCMOFST/2)$ $TE=\text{SLOT}/2+(INT)(PCMOFST/2);$ while LE and TE of the PWM signal PWM_B are calculated by:

$LE=(INT)(PCMOFST+1)/2)$ $TE=\text{SLOT}-(INT)((PCMOFST+1)/2);$

Where INT indicates a rounding operation for PCMOFST/2 or (PCMOFST+1)/2.

On the other hand, in the Y-series PCM-PWM converter 31, LE and TE of the PWM signal PWM_A are calculated by:

$LE=\text{SLOT}/2-(INT)((PCMOFST+1)/2)$ $TE=\text{SLOT}/2+(INT)((PCMOFST+1)/2);$ while LE and TE of the PWM signal PWM_B are calculated by:

$LE=(INT)((PCMOFST-1)/2)$ $TE=\text{SLOT}-(INT)((PCMOFST-1)/2);$

Where INT indicates a rounding operation for (PCMOFST+1)/2 or (PCMOFST-1)/2.

The switch 33 supplies the difference detector 34 with the PWM signals PWM_A and PWM_B from one of the PCM-PWM converters 31, 32. The switch 33 is controlled by the controller 35.

The difference detector 34 outputs the difference PWM_A−PWM_B between the supplied PWM signals PWM_A and PWM_B as a final PWM signal.

The controller 35 acts as odd-number detecting means to determine whether or not the digital signal PCMOFST is an odd-number or an even-number. The controller 35 also controls a selecting position of the switch 33 in accordance with the determination result. Specifically, when the least significant bit (LSB) of the digital signal PCMOFST is 0, the digital signal PCMOFST is determined to represent an even-number, whereas when the least significant bit is 1, the digital signal PCMOFST is determined to represent an odd-number. When the digital signal PCMOFST is determined to represent an even-number, the switch 33 is instructed to select the output of the X-series PCM-PWM converter 31. When the digital signal PCMOFST is determined to represent an odd-number, the switch 33 is instructed to select the output of the Y-series PCM-PWM converter 32.

Figure 14:
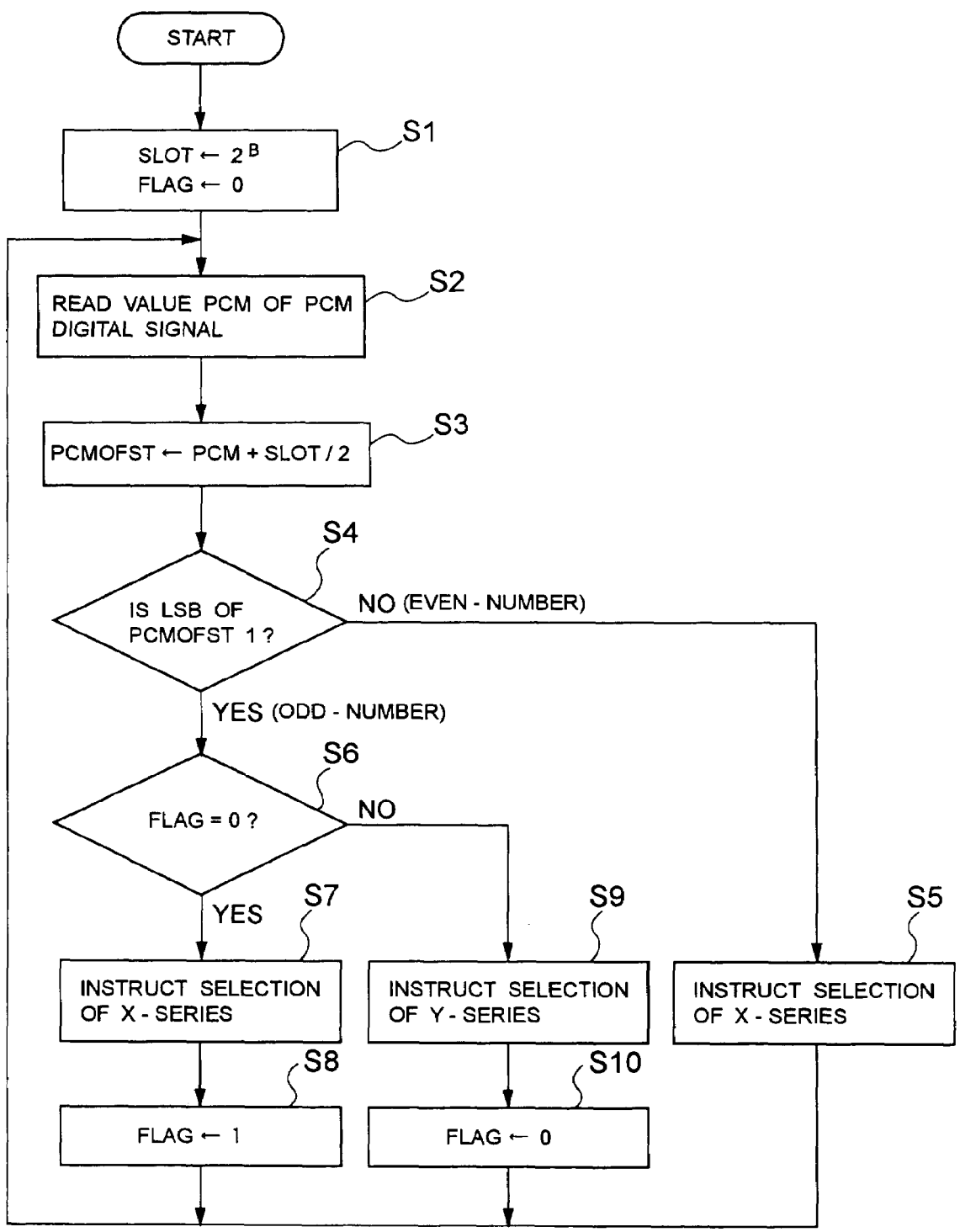
FIG. 14 is a flow chart showing the operation of the PWM signal generator in FIG. 12.

The operation of the PWM signal converter in the foregoing configuration will be described along a flow chart of FIG. 14. First, the number of slots SLOT is set to $2^B$, and a flag FLAG is set to 0 (step S1). A PCM input digital signal is read in synchronism with a sampling timing (step S2), and the digital signal PCMOFST is set to PCM+SLOT/2 in the offset circuit 30 (step S3). The controller 35 determines whether or not the least significant bit (LSB) of the digital signal PCMOFST is 1 (step S4). If the least significant bit is 0, i.e., if the digital signal PCMOFST represents an even-number, an X-series selection instruction is generated from the controller 35 to the switch 33 (step S5). Thus, the output signals PWM_A and PWM_B of the X-series PCM-PWM converter 31 are supplied to the difference detector 34 through the switch 33, and a final PWM signal PWM_A−PWM_B (first pulse width modulation signal) is output from the difference detector 34 in accordance with the output signals PWM_A and PWM_B of the X-series PCM-PWM converter 31.

If the controller 35 determines at step S4 that the least significant bit is 1, the controller 35 again determines whether or not the flag FLAG is 0 (step S6). If FLAG=0, an X-series selection instruction is generated in a manner similar to step S5 (step S7). Then, the flag FLAG is set to 1 (step S8). On the other hand, if FLAG=1 at step S6, a Y-series selection instruction is generated from the controller 35 (step S9). Then, the flag FLAG is set to 0 (step S10). Thus, the output signals PWM_A and PWM_B of the Y-series PCM-PWM converter 32 are supplied to the difference detector 34 through the switch 33, and a final PWM signal PWM_A–PWM_B (second pulse width modulation signal) is output from the difference detector 34 in accordance with the output signals PWM_A and PWM_B of the Y-series PCM-PWM converter 32.

After the execution of step S5, S8, or S10, the flow returns to step S2 to repeat the foregoing operation.

Thus, when the digital signal PCMOFST represents an odd-number, the flag FLAG alternately repeats 0 and 1, so that the difference detector 34 alternately outputs the PWM signal PWM_A–PWM_B (first pulse width modulation signal) associated with the X-series and the PWM signal PWM_A-PWM_B (second pulse width modulation signal) associated with the Y-series.

Figure 15:
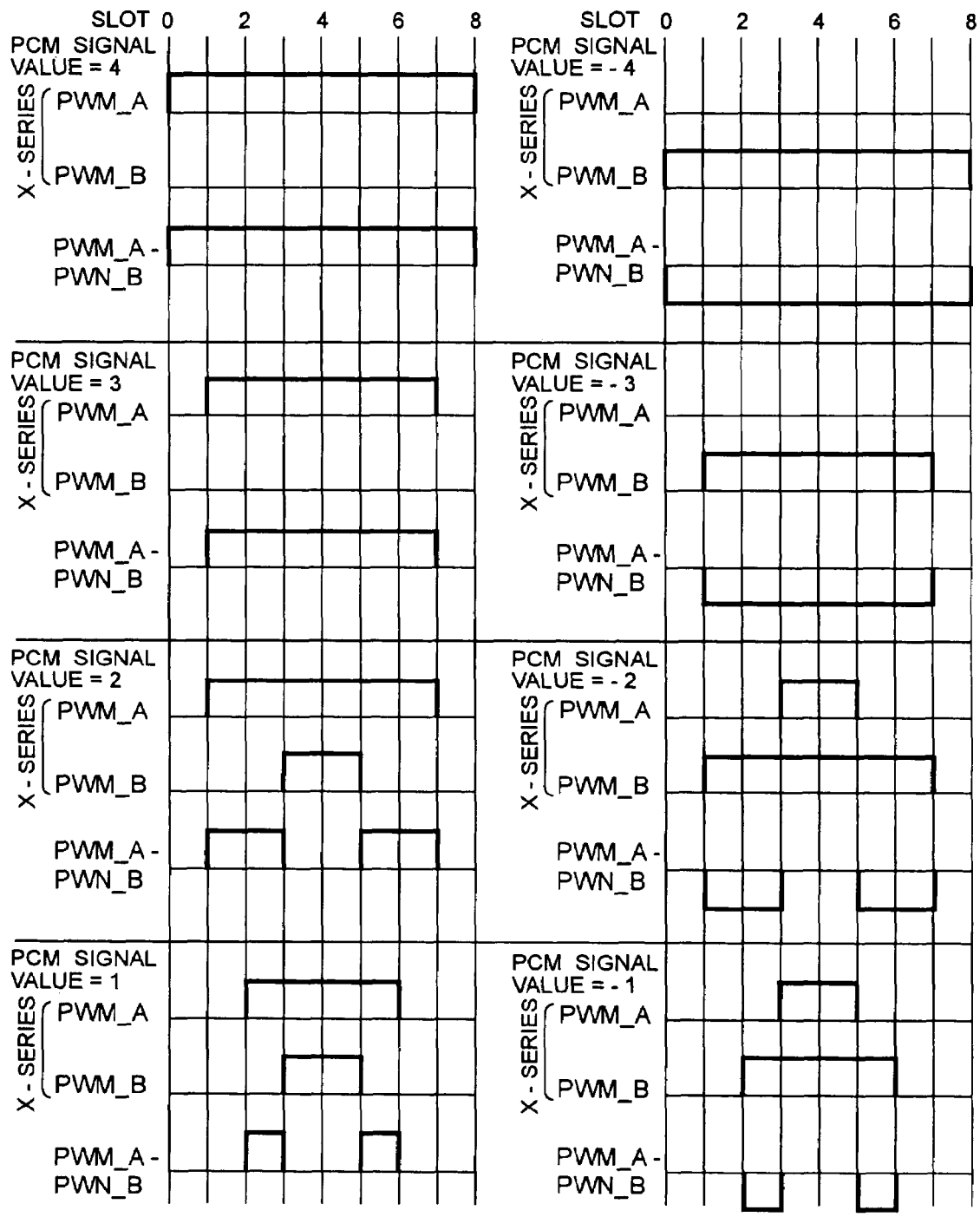
FIG. 15 is a diagram showing a method of generating a PWM signal for the PWM signal generator in FIG. 12.
Figure 16:
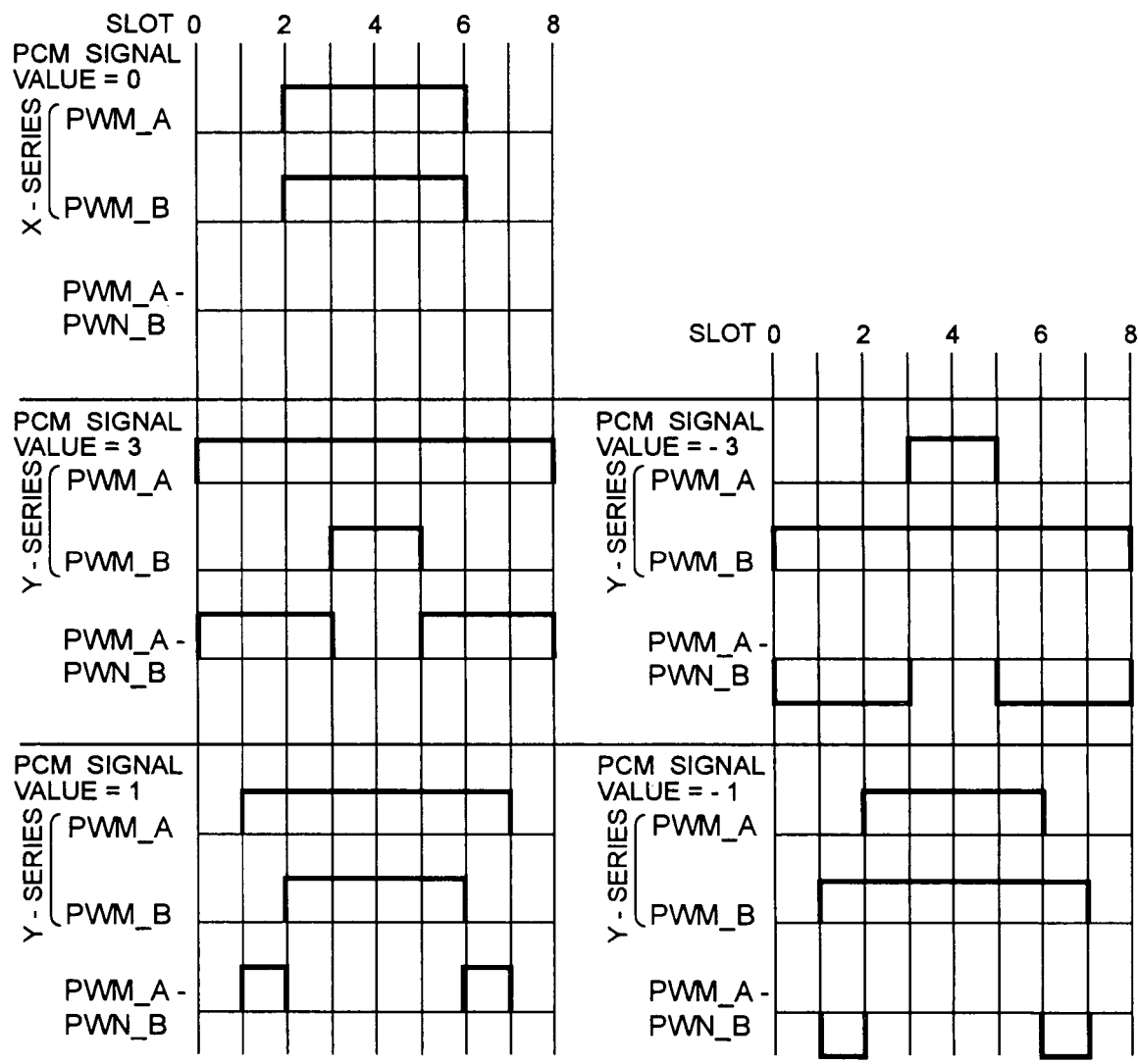
FIG. 16 is a diagram showing a method of generating a PWM signal for the PWM signal generator in FIG. 12.

FIGS. 15 and 16 show the waveforms of the PWM signals PWM_A, PWM_B, and PWM_A–PWM_B associated with the X-series and the PWM signals PWM_A, PWM_B, and PWM_A–PWM_B associated with the Y-series for a 3-bit digital signal value (4 to −4). While the digital signal can take a value in the range of 3 to −3, 4 and −4 are also shown for facilitating the understanding of the description. Odd-numbers (1, 3, −3, −1) alone are shown for the PWM signals PWM_A, PWM_B, and PWM_A–PWM_B associated with the Y-series.

In FIGS. 15 and 16, in the X-series, when the PCM digital signal has a maximum value of 4, the PWM signal PWM_A has a maximum width of eight slots, while the PWM signal PWM_B has a minimum width of zero slot. When the PCM digital signal value is reduced by one from this state to become three, (X1) the PWM signal PWM_A is reduced by two slots to have a width of six slots such that it is symmetric with respect to four. In other words, one slot is reduced at each of both ends. On the other hand, the PWM signal PWM_B maintains the previous value 0. When the PCM digital signal value is further reduced by one to become two, (X2) the PWM signal PWM_A maintains the previous value. On the other hand, the PWM signal PWM_B is increased by two slots such that it is symmetric with respect to four to have a width of two slots. Subsequently, the operations (X1) and (X2) are alternately performed each time the PCM digital signal value is decreased by one.

While the signal waveform of the X-series PWM_A–PWM_B is symmetric to even-number PCM signal values with respect to the positions of ¼ and ¾ of the maximum number of slots, it is not symmetric to odd-number PCM signal values. Therefore, the Y-series is generated for the odd-number PCM signal values by inverting the signal waveform of the X-series PWM_A–PWM_B with respect to the positions of ¼ and ¾ of the maximum number of slots.

In the Y-series, as the PCM digital signal is reduced by one from four to become three, (Y1) the PWM signal PWM_A maintains the previous value. On the other hand, the PWM signal PWM_B is increased by two slots such that it is symmetric with respect to four. As the PCM digital signal is reduced by one from three to become two, (Y2) the PWM signal PWM_A is reduced by two slots such that it is symmetric with respect to four to have a width of six slots, though not shown. On the other hand, the PWM signal PWM_B maintains the previous value of 2. Subsequently, the operations (Y1) and (Y2) are alternately performed each time the PCM digital signal value is decreased by one.

Figure 17:
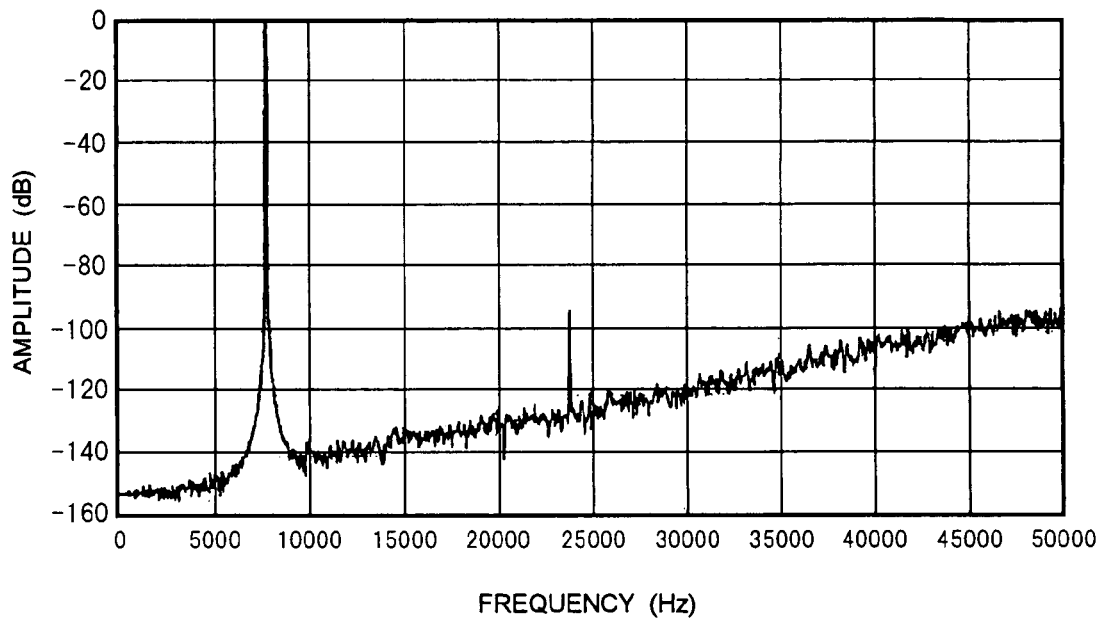
FIG. 17 is a diagram showing the frequency spectrum of a PWM signal using an X-series alone.

The frequency spectrum of the PWM signal PWM_A–PWM_B associated with the X-series alone is, for example, as shown in FIG. 17. It can be seen from the spectrum of FIG. 17 that the harmonic distortion is equivalent to that of the double-sided three-valued PWM, whereas the noise floor is higher than that of the single-sided three-valued PWM.

Figure 18:
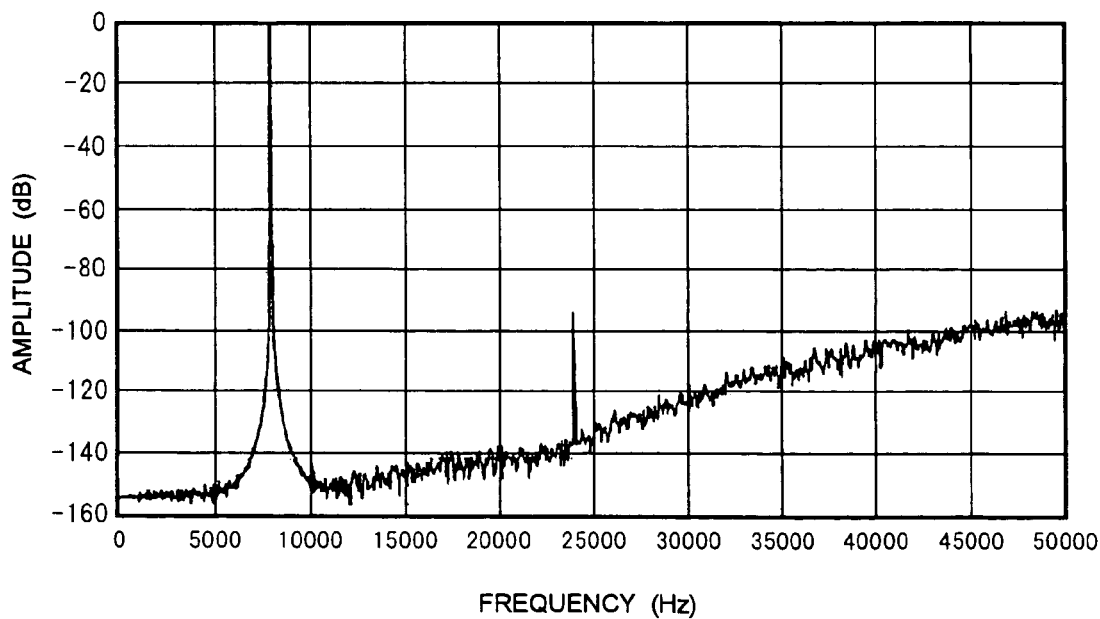
FIG. 18 is a diagram showing the frequency spectrum of a PWM signal using an X-series and a Y-series.

The frequency spectrum of the PWM output signal comprised of the PWM signal PWM_A–PWM_B associated with the X-series and the PWM signal PWM_A–PWM_B associated with the Y-series alternately output from the difference detector 34 is, for example, as shown in FIG. 18. The harmonic distortion is equivalent to that of the double-sided three-valued PWM, and the noise floor is equivalent to that of the single-sided three-value PWM.

In the PWM signal generator according to the present invention, the PWM signals PWM_A and PWM_B are increased or decreased in units of two slots, it is possible to generate a PWM signal symmetric with respect to the center of a maximum slot width without doubling the clock frequency. Thus, the harmonic distortion can be reduced to a level equivalent to that of the double-sided three-valued PWM.

Also, for odd-number digital signals, the PWM signal PWM_A–PWM_B associated with the X-series and the PWM signal PWM_A–PWM_B associated with the Y-series are alternately output. By alternately outputting the X-series and Y-series, as a result, the output PWM_A–PWM_B is quasi symmetric with respect to the positions of ¼ and ¾ of the maximum number of slots, so that the noise floor can be reduced to a level equivalent to that of the single-sided three-valued PWM.

It should be understood that the operations for generating the waveforms of the X-series and Y-series may be exchageable.

Also, while in the embodiment described above, the PWM signal generator comprises the offset circuit 30, PCM-PWM converters 31, 32, switch 33, difference detector 34, and controller 35, this is not a limitation. Instead of independently providing the X-series PCM-PWM converter 31 and Y-series PCM-PWM converter 32, the X-series and Y-series PWM signals may be generated by a single PCM-PWM converter and the controller as shown in the flow chart of FIG. 14 to omit the switch.

Figure 1:
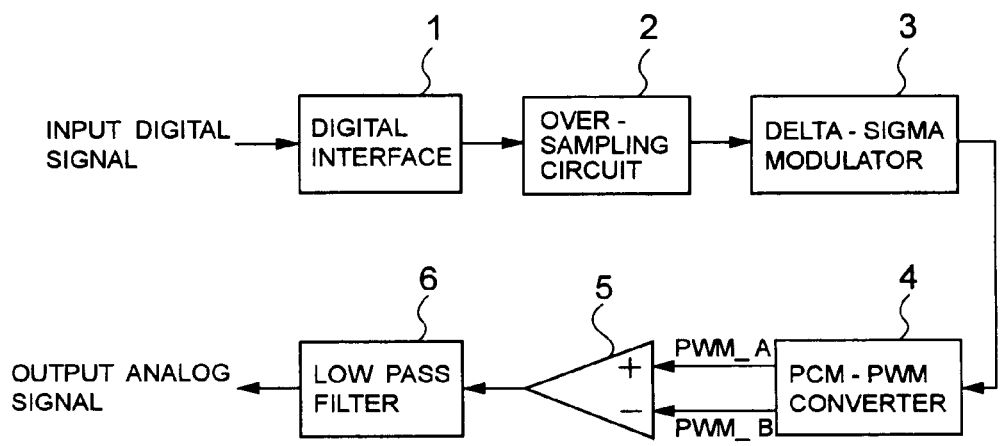
FIG. 1 is a block diagram showing the configuration of a digital-to-analog converter.
Figure 2:
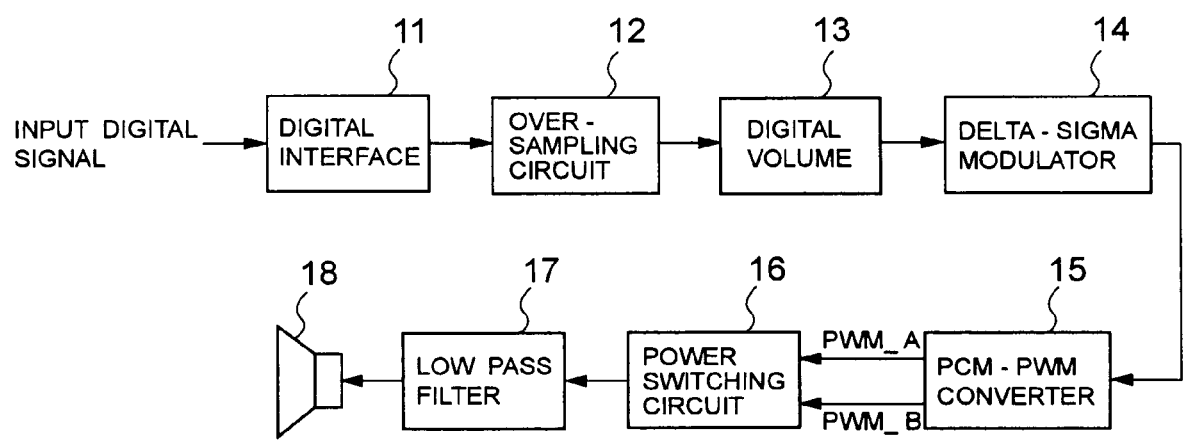
FIG. 2 is a block diagram showing the configuration of a digital amplifier.
Figure 3:
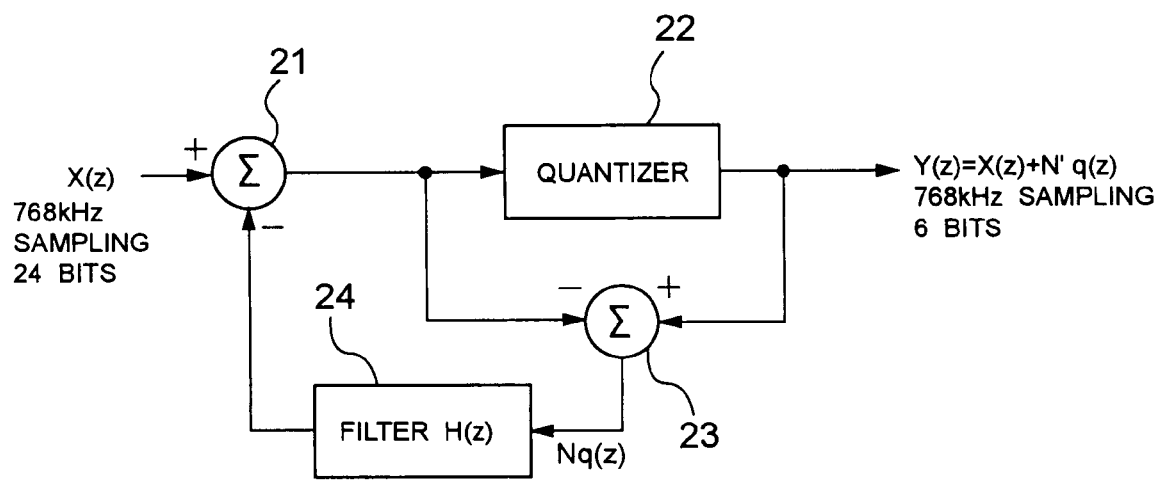
FIG. 3 is a diagram showing the configuration of a delta-sigma modulator in the amplifier of FIG. 2.
Figure 4A:
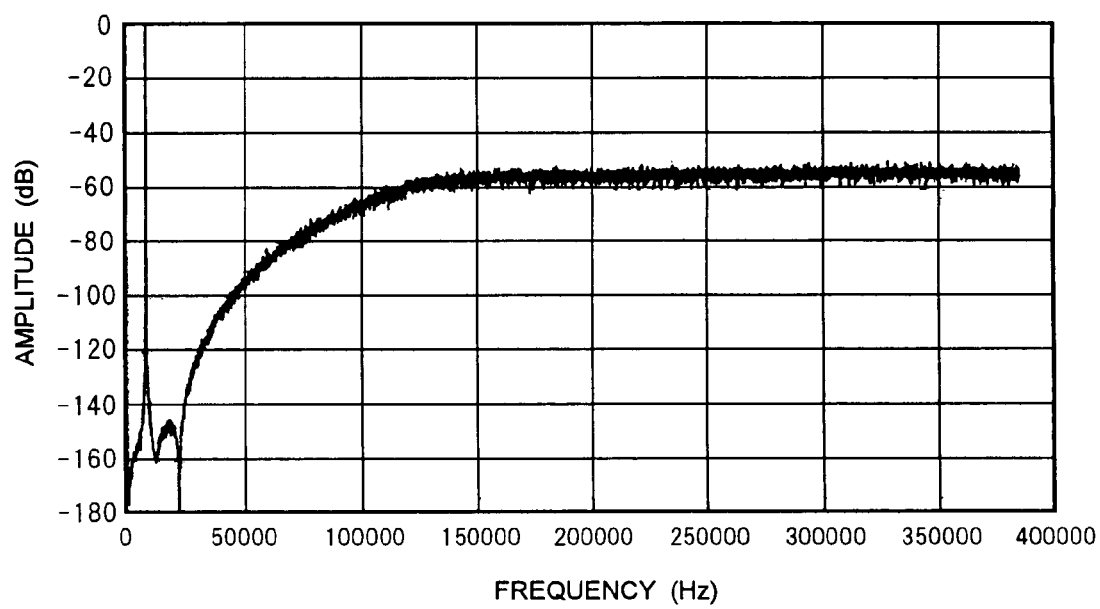
FIGS. 4A and 4B are diagrams showing the frequency spectra by the delta-sigma modulator.
Figure 4B:
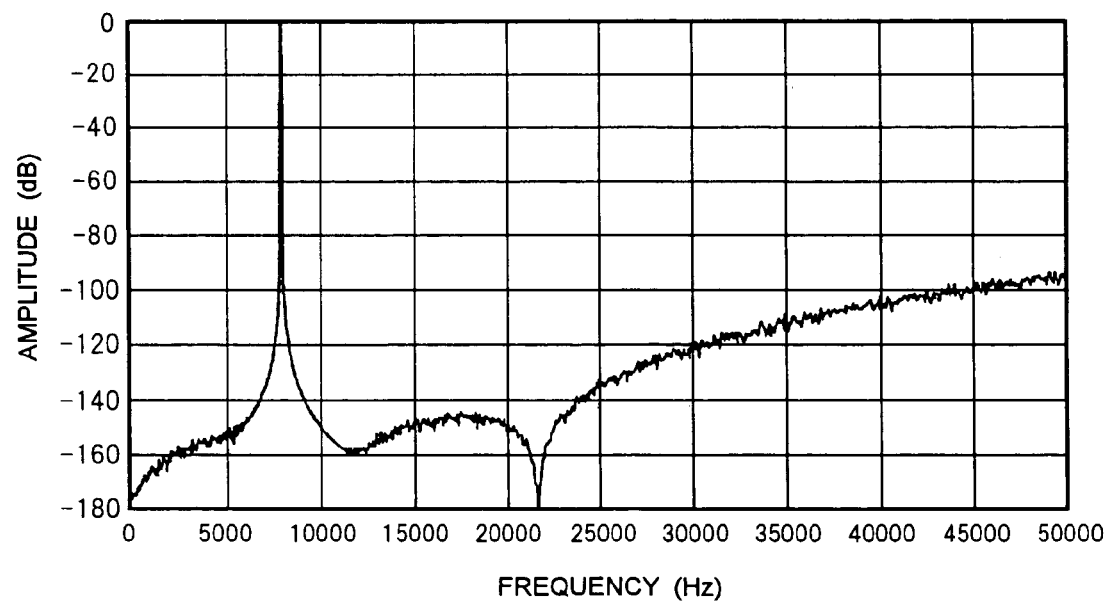
Figure 5:
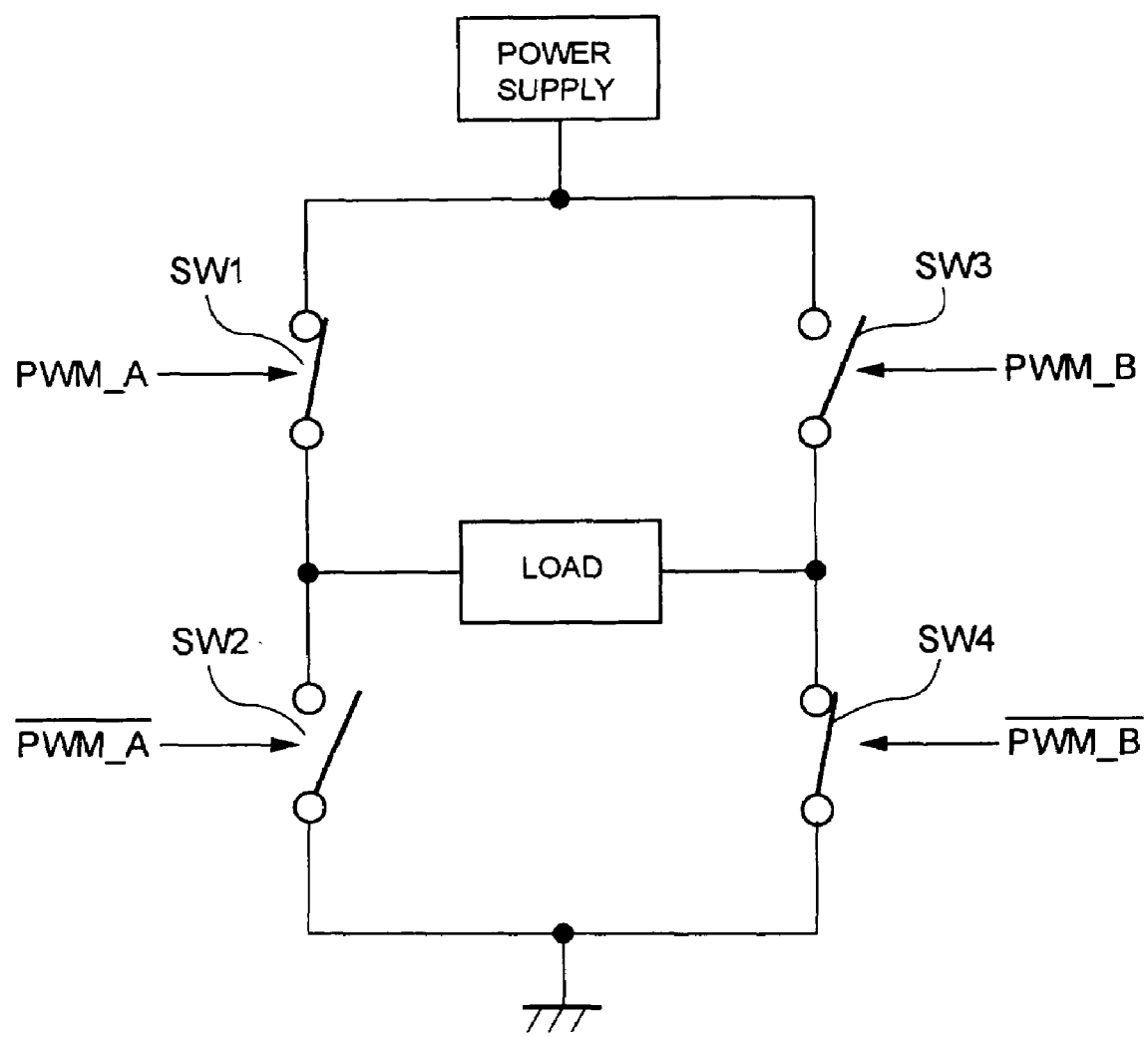
FIG. 5 is a diagram showing the configuration of a power switching circuit in the amplifier of FIG. 2.
Figure 6:
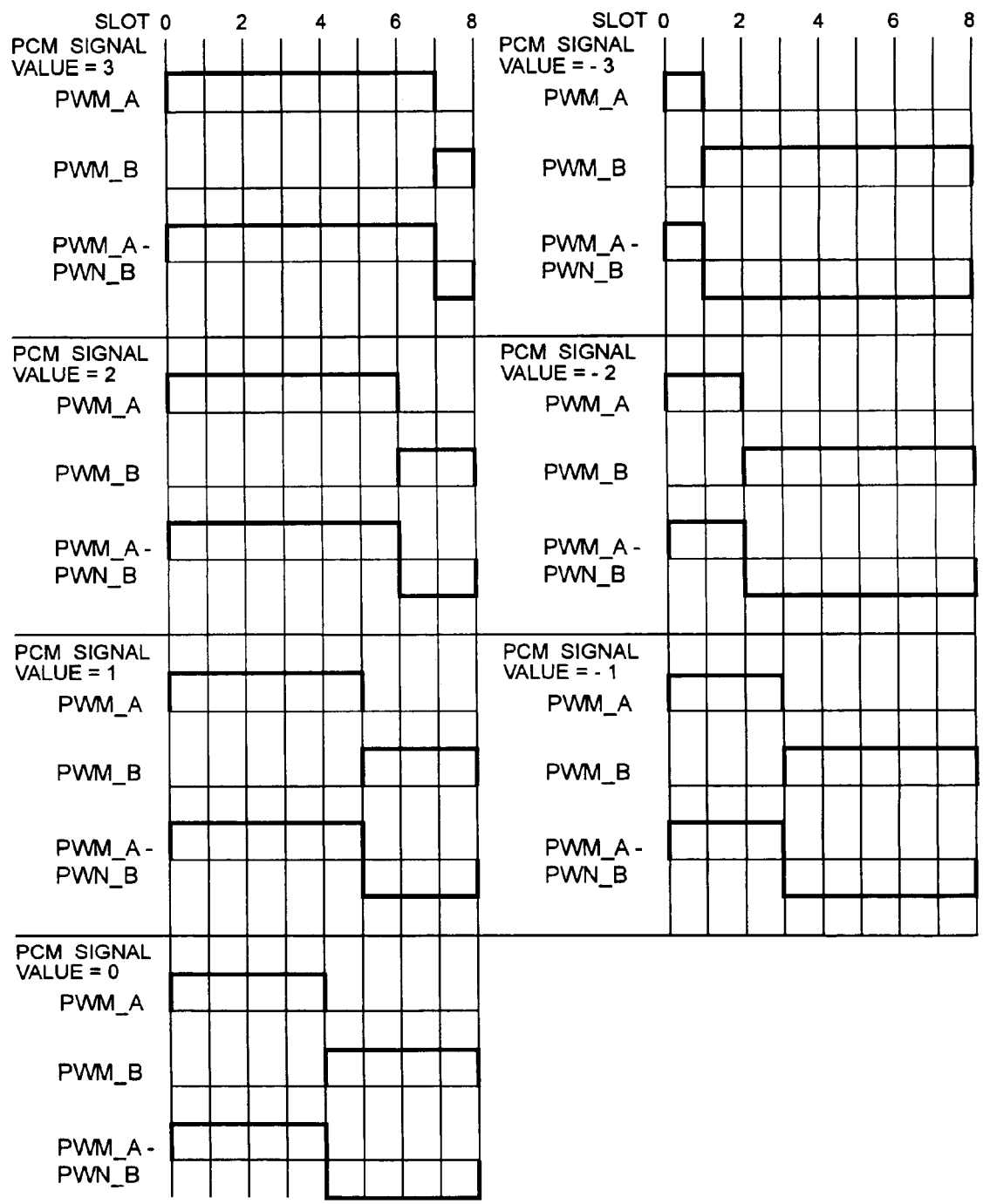
FIG. 6 is a diagram showing a method of generating a single-sided binary PWM signal.
Figure 7:
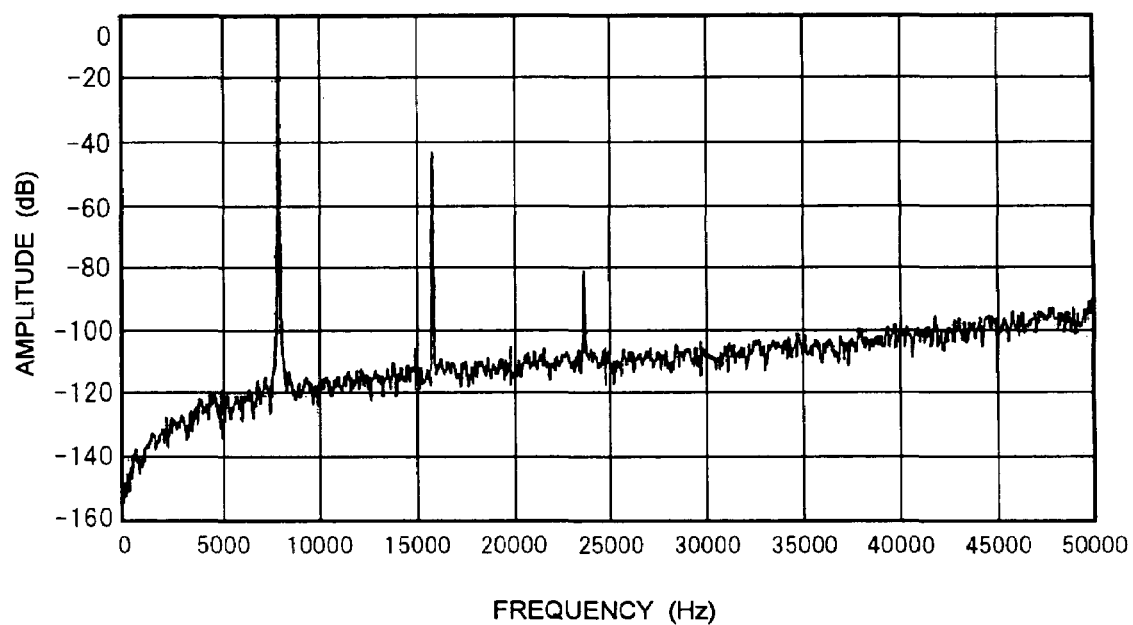
FIG. 7 is a diagram showing the frequency spectrum of the single-sided binary PWM signal.
Figure 8:
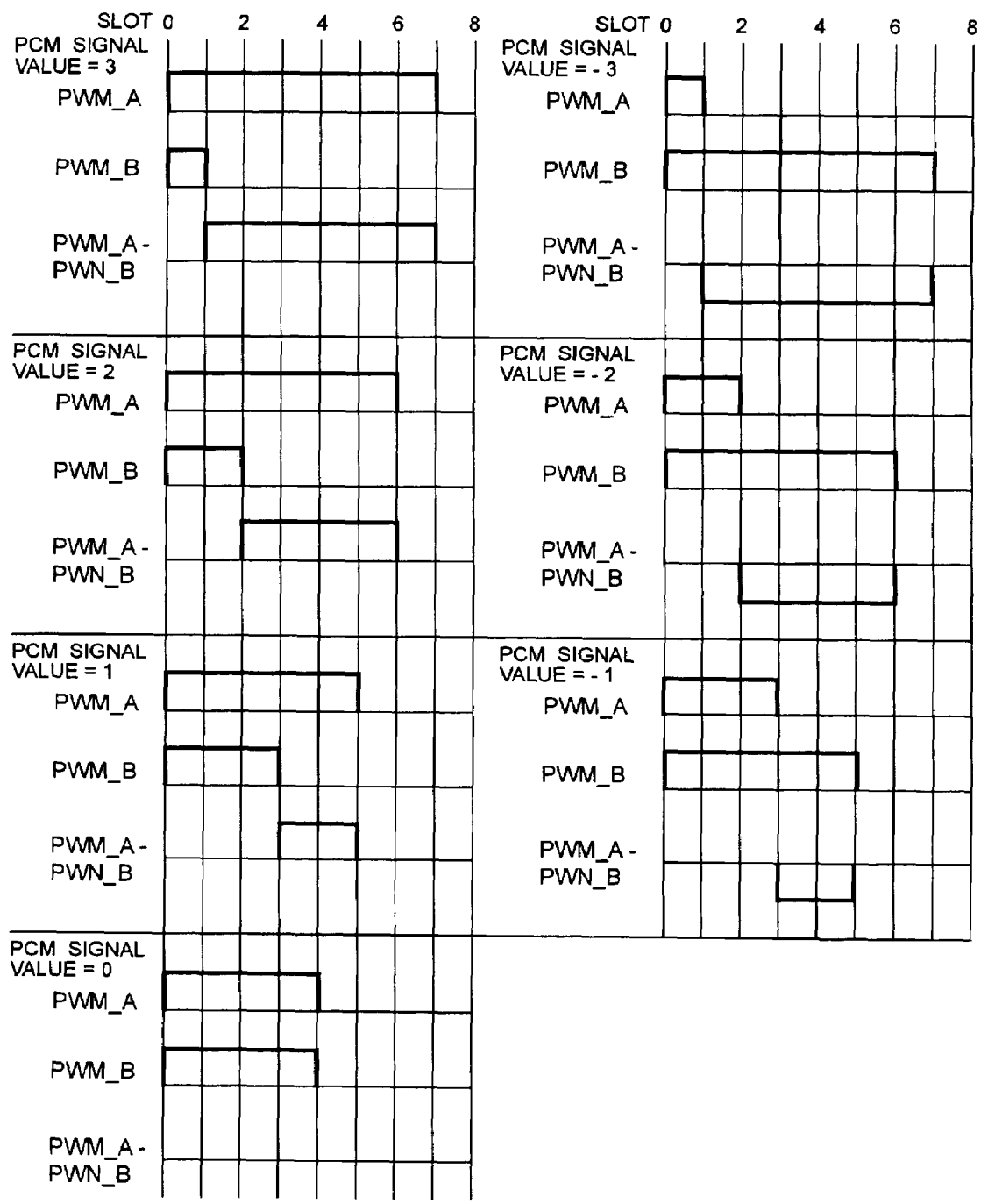
FIG. 8 is a diagram showing a method of generating a single-sided three-valued PWM signal.
Figure 9:
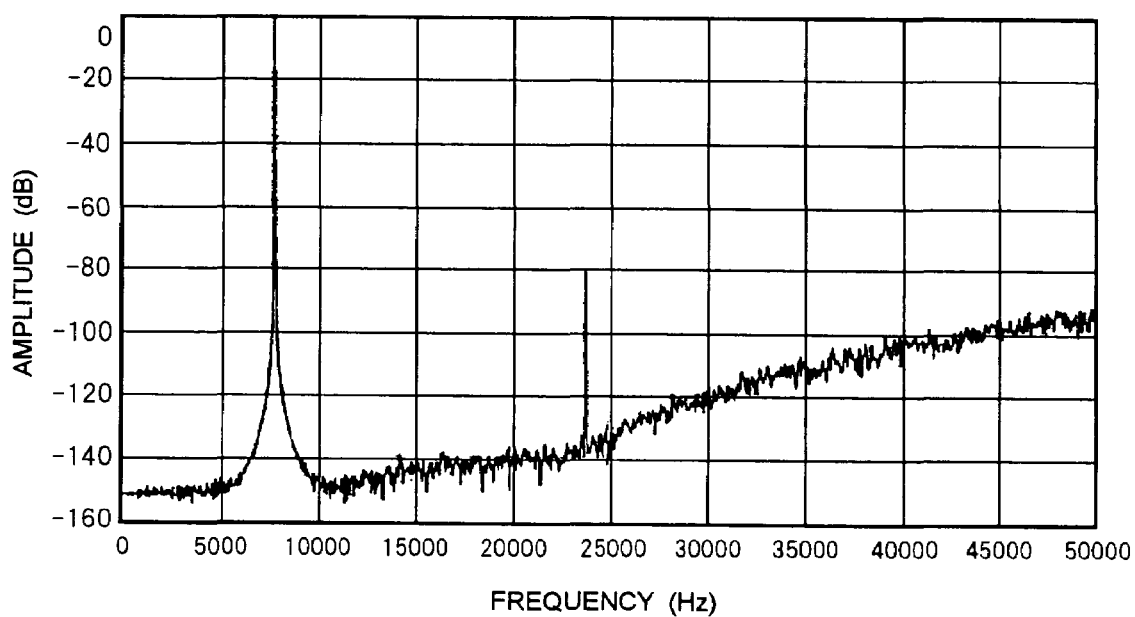
FIG. 9 is a diagram showing the frequency spectrum of the single-sided three-valued PWM signal.
Figure 10:
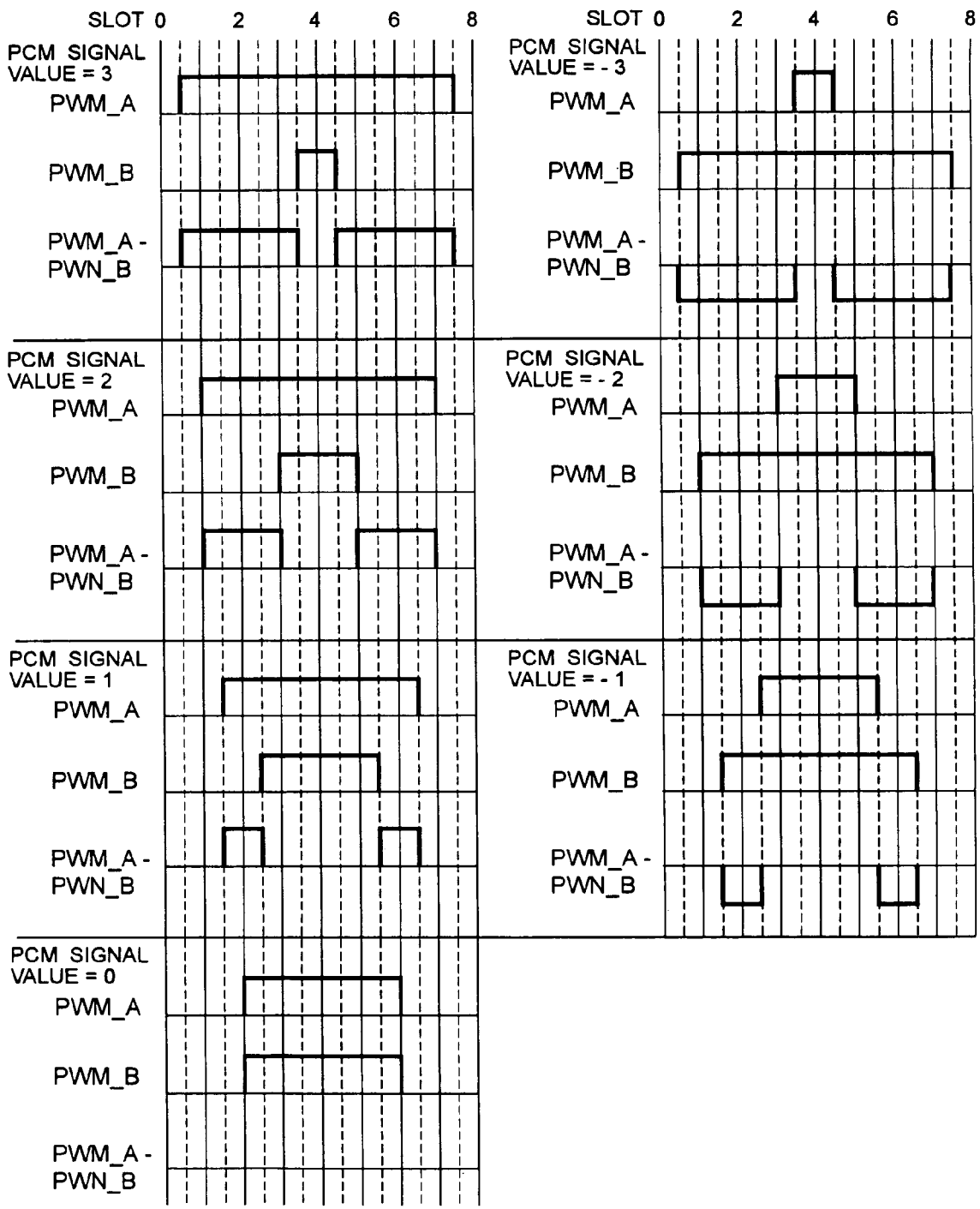
FIG. 10 is a diagram showing a method of generating a double-sided three-valued PWM signal.
Figure 11:
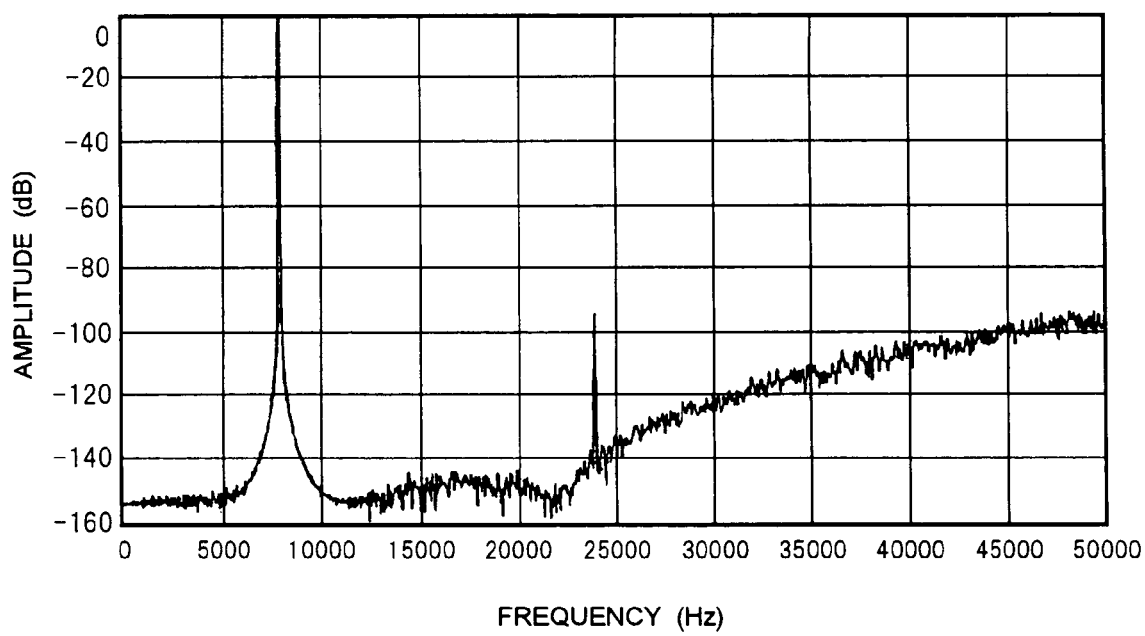
FIG. 11 is a diagram showing the frequency spectrum of the double-sided three-valued PWM signal.

Further, the PWM signal generator according to the present invention can be applied to the digital-to-analog converter shown in FIG. 1 and the digital amplifier shown in FIG. 2.

As described above, the generation of the pulse width modulation signal according to the present invention involves generating one or two pulses having a pulse width or a total pulse width corresponding to a value represented by a pulse code modulation digital signal and placed in a symmetric positional relationship with respect to the position of the half of a predetermined length, as a first pulse width modulation signal, and when the digital signal represents an odd value, alternately generating the first pulse width modulation signal and a second pulse width modulation signal comprising two pulses having a total pulse width corresponding to the odd value and placed in a symmetric positional relationship with one pulse or two pulses of the first pulse width modulation signal with respect to the positions of ¼ and ¾ of a predetermined length, thereby making it possible to reduce both the harmonic distortion and noise floor without changing the clock frequency.

This application is based on a Japanese Application No. 2003-121163 which is hereby incorporated by reference.

What is claimed is:

1. A pulse width modulation (PWM) signal generator comprising a signal generating device for generating one or two pulses which have a pulse width or a total pulse width corresponding to a value represented by a pulse code modulation digital signal and which have a symmetric positional relationship with respect to the position of one half of a predetermined length, as a first pulse width modulation signal, wherein
said signal generating device includes a PCM (pulse code modulation)-PWM converter which generates a first pulse and a second pulse in accordance with the value represented by the digital signal, and a difference detector which outputs the difference between the first pulse and the second pulse, as the first pulse width modulation signal, and
when the value represented by the digital signal is zero, the first pulse and the second pulse are equal to each other in pulse width, and when the value represented by the digital signal changes by one, one of the first and second pulses does not change in pulse width and the other of the first and second pulses changes in pulse width by two slots.

2. The PWM signal generator according to claim 1, further comprising an odd-number detector which detects that the value represented by the digital signal represents an odd-number, wherein when the value represented by the digital signal represents an odd-number, said signal generating device alternately generates the first pulse width modulation signal, and a second pulse width modulation signal comprising two pulses having a total pulse width corresponding to the odd value and placed in a symmetric positional relationship to the one pulse or two pulses of the first pulse width modulation signal with respect to the positions of ¼ and ¾ of the predetermined length.

3. The PWM signal generator according to claim 2, wherein a slot value LE at a leading edge and a slot value TE at a trailing edge of the first pulse are calculated by:

$LE=SLOT/2-(INT)(PCMOFST/2)$ $TE=SLOT/2+(INT)(PCMOFST/2)$ when the first pulse width modulation signal is generated, where SLOT is the number of slots of the predetermined length, PCMOFST is a value of the digital signal offset by SLOT/2, and INT is a rounding operation;
a slot value LE at a leading edge position and a slot value TE at a trailing edge position of the second pulse are calculated by:

$LE=(INT)((PCMOFST+1)/2)$ $TE=SLOT-(INT)((PCMOFST+1)/2)$ when the first pulse width modulation signal is generated;
the slot value LE at the leading edge position and the slot value TE at the trailing edge position of the first pulse are calculated by:

$LE=SLOT/2-(INT)((PCMOFST+1)/2)$ $TE=SLOT/2+(INT)((PCMOFST+1)/2)$ when the second pulse width modulation signal is generated; and
the slot value LE at the leading edge position and the slot value TE at the trailing edge position of the second pulse are calculated by:

$LE=(INT)((PCMOFST-1)/2)$ $TE=SLOT-(INT)((PCMOFST-1)/2)$ when the second pulse width modulation signal is generated.

4. The PWM signal generator according to claim 2, wherein said odd-number detector determines an odd-number or an even-number in accordance with the value at the least significant bit of the digital signal.

5. The PWM signal generator according to claim 2, wherein said signal generating device includes:
a first signal generator which generates the first pulse width modulation signal;
a second signal generator which generates the second pulse width modulation signal; and
a selector which outputs the first pulse width modulation signal when the value represented by the digital signal represents an even-number, and alternately outputs the first pulse width modulation signal and the second pulse width modulation signal when the value represented by the digital signal represents an odd-number.

6. A PWM signal generating method for generating one or two pulses having a pulse width or a total pulse width corresponding to a value represented by a pulse code modulation digital signal and placed in a symmetric positional relationship with respect to the position of one half of a predetermined length, as a first pulse width modulation signal, the method comprising the steps of:
generating a first pulse and a second pulse in accordance with a value represented by the digital signal;
outputting the difference between the first pulse and the second pulse, as the first pulse width modulation signal; and
controlling the first pulse and the second pulse so that when the value represented by the digital signal is zero, the first pulse and the second pulse are equal to each other in pulse width, and when the value represented by the digital signal changes by one, one of the first and second pulses does not change in pulse width and the other of the first and second pulses changes in pulse width by two slots.

7. A PWM signal generating method for generating one or two pulses having a pulse width or a total pulse width corresponding to a value represented by a pulse code modulation digital signal and placed in a symmetric positional relationship with respect to the position of one half of a predetermined length, as a first pulse width modulation signal, the method comprising the steps of:
controlling the first pulse and the second pulse so that when the value represented by the digital signal is zero, the first pulse and the second pulse are equal to each other in pulse width, and when the value represented by the digital signal changes by one, one of the first and second pulses does not change in pulse width and the other of the first and second pulses changes in pulse width by two slots;
detecting that a value represented by the digital signal is an odd-number; and
when the value represented by the digital signal is an odd-number, generating the first pulse width modulation signal and a second pulse width modulation signal, alternately, said second pulse width modulation signal comprising two pulses having a total pulse width corresponding to the odd value and placed in a symmetric positional relationship to the one pulse or two pulses of the first pulse width modulation signal with respect to the positions of ¼ and ¾ of the predetermined length.

8. A digital-to-analog converter comprising:
an oversampling circuit which oversamples an input pulse code modulation digital signal;

a delta-sigma modulator which decreases the number of quantization bits of an output digital signal of said oversampling circuit;

a PWM signal generator which generates one or two pulses having a pulse width or a total pulse width corresponding to a value represented by an output digital signal of said delta-sigma modulator and placed in a symmetric positional relationship with respect to the position of one half of a predetermined length, as a first pulse width modulation signal; and a low pass filter which outputs a low band component of the first pulse width modulation signal, wherein said PWM signal generator includes a PCM-PWM converter which generates a first pulse and a second pulse in accordance with the value represented by the output digital signal of said delta-sigma modulator, and a difference detector which outputs the difference between the first pulse and the second pulse, as the first pulse width modulation signal; and when the value represented by the output digital signal of said delta-sigma modulator is zero, the first pulse and the second pulse are equal to each other in pulse width, and when the value represented by the output digital signal of said delta-sigma modulator changes by one, one of the first and second pulses does not change in pulse width and the other of the first and second pulses changes in pulse width by two slots.

9. A digital amplifier comprising:

an oversampling circuit which oversamples a pulse code modulation input digital signal;

a digital volume which changes a gain indicated by an output digital signal of said oversampling circuit;

a delta-sigma modulator which decreases the number of quantization bits of an output digital signal of said digital volume;

a PWM signal generator which generates one or two pulses having a pulse width or a total pulse width corresponding to a value represented by an output digital signal of said delta-sigma modulator and placed in a symmetric positional relationship with respect to the position of one half of a predetermined length, as a first pulse width modulation signal; and a low pass filter which outputs a low band component of the first pulse width modulation signal, wherein said PWM signal generator includes a PCM-PWM converter which generates a first pulse and a second pulse in accordance with the value represented by the output digital signal of said delta-sigma modulator, and a difference detector which outputs the difference between the first pulse and the second pulse, as the first pulse width modulation signal; and when the value represented by the output digital signal of said delta-sigma modulator is zero, the first pulse and the second pulse are equal to each other in pulse width, and when the value represented by the output digital signal of said delta-sigma modulator changes by one, one of the first and second pulses does not change in pulse width and the other of the first and second pulses changes in pulse width by two slots.

* * * * *